United States Patent
Kim et al.

(10) Patent No.: US 8,890,148 B2
(45) Date of Patent: Nov. 18, 2014

(54) ORGANIC LIGHT EMITTING DISPLAY AND METHOD OF MANUFACTURING THE SAME

(75) Inventors: Min-Kyu Kim, Yongin (KR); Jae-Wook Kang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 482 days.

(21) Appl. No.: 12/881,686

(22) Filed: Sep. 14, 2010

(65) Prior Publication Data
US 2011/0140112 A1 Jun. 16, 2011

(30) Foreign Application Priority Data
Dec. 16, 2009 (KR) .................... 10-2009-0125685

(51) Int. Cl.
*H01L 31/00* (2006.01)
*H01L 27/32* (2006.01)

(52) U.S. Cl.
CPC .................... *H01L 27/3248* (2013.01)
USPC ............... 257/59; 257/5; 257/72; 257/255; 257/E27.133

(58) Field of Classification Search
CPC .............. H01I 27/1214; H01I 27/12
USPC ............ 257/59, 5, 72, E27.133, 255
See application file for complete search history.

(56) References Cited

U.S. PATENT DOCUMENTS

| | | | |
|---|---|---|---|
| 6,521,912 B1 * | 2/2003 | Sakama et al. | 257/57 |
| 2007/0188089 A1 * | 8/2007 | Choi et al. | 313/506 |
| 2009/0020759 A1 | 1/2009 | Yamazaki | |
| 2009/0128014 A1 * | 5/2009 | Kitazume | 313/504 |
| 2009/0134390 A1 * | 5/2009 | Kodama et al. | 257/43 |
| 2010/0051936 A1 | 3/2010 | Hayashi et al. | |

FOREIGN PATENT DOCUMENTS

| | | |
|---|---|---|
| JP | 2007-073559 | 3/2007 |
| JP | 2007-235102 | 9/2007 |
| JP | 2008-281988 | 11/2008 |
| KR | 10-2009-0009716 A | 1/2009 |
| KR | 10-2009-0089444 A | 8/2009 |

OTHER PUBLICATIONS

Korean Office Action dated May 16, 2011 for Korean Patent Application No. KR 10-2009-0125685 which corresponds to captioned U.S. Appl. No. 12/881,686.

* cited by examiner

*Primary Examiner* — Dale E Page
(74) *Attorney, Agent, or Firm* — Knobbe, Martens, Olson & Bear, LLP

(57) ABSTRACT

An organic light emitting display and a method of manufacturing the same are disclosed. In one embodiment, the display includes a gate electrode formed over a substrate and an active layer electrically insulated from the gate electrode, wherein the gate electrode is closer to the substrate than the active layer. The display further includes i) a first gate insulating layer and a second gate insulating layer formed between the gate electrode and active layer so as to electrically insulate the active layer from the gate electrode and ii) source and drain electrodes each contacting the active layer.

11 Claims, 7 Drawing Sheets

ORGANIC LIGHT EMITTING DISPLAY AND METHOD OF MANUFACTURING THE SAME

CROSS-REFERENCE TO RELATED PATENT APPLICATION

This application claims the benefit of Korean Patent Application No. 10-2009-0125685, filed on Dec. 16, 2009, in the Korean Intellectual Property Office, the disclosure of which is incorporated herein in its entirety by reference.

BACKGROUND

1. Field

The described technology generally relates to an organic light emitting display and a method of manufacturing the same, and more particularly, to an organic light emitting display manufactured in a simple manufacturing process and a method of manufacturing the same.

2. Description of the Related Technology

In flat panel displays, such as organic light emitting displays, liquid crystal displays, a substrate includes patterns of electrical components such as a thin film transistor, a capacitor, wiring connecting the components.

SUMMARY

One aspect is an organic light emitting display manufactured with a reduced number of patterning processes using a mask, and a method of manufacturing the same.

Another aspect is an organic light emitting display including: a gate electrode formed on a substrate; an active layer insulated from the gate electrode; a first gate insulating layer and a second gate insulating layer to insulate the gate electrode and the active layer; and source and drain electrodes respectively contacting the active layer.

The active layer may include oxygen and at least one selected from the group consisting of Ga, In, Zn, Hf, and Sn.

The first gate insulating layer and the second gate insulating layer may be formed adjacent to each other.

The organic light emitting display may further include: a plurality of pixel electrodes formed on the first gate insulating layer; pixel-defining layers disposed between the plurality of pixel electrodes; a plurality of organic layers disposed on the plurality of pixel electrodes and the pixel defining layers; and a counter electrode formed on the plurality of organic layers.

Another aspect is a method of manufacturing an organic light emitting display, the method comprising: a first mask process for forming a first conductive layer on a substrate and patterning the first conductive layer as a gate electrode of a thin film transistor; a second mask process for forming a first insulating layer on the resulting structure obtained according to the first mask process, forming a second conductive layer on the first insulating layer, and patterning the first insulating layer and the second conductive layer as a pixel electrode; a third mask process for forming a second insulating layer on the resulting structure obtained according to the second mask process, forming a semiconductor layer on the second insulating layer, and patterning the second insulating layer and the semiconductor layer as an active layer of the thin film transistor; a fourth mask process for removing a portion of the second insulating layer to expose a portion of the pixel electrode; a fifth mask process for forming a third conductive layer on the resulting structure obtained according to the fourth mask process and patterning the third conductive layer as source and drain electrodes of the thin film transistor; and a sixth mask process for forming a third insulating layer on the resulting structure obtained according to the fifth mask process and removing the third insulating layer to expose the pixel electrode.

The active layer may include oxygen and at least one element selected from the group consisting of Ga, In, Zn, Hf, and Sn.

The first insulating layer may be formed as a first gate insulating layer, and the second insulating layer may be formed as a second gate insulating layer, wherein the first gate insulating layer and the second gate insulating layer are formed adjacent to each other.

The method may further include sequentially forming an intermediate layer comprising an emissive layer and a counter electrode on the resulting structure obtained according to the sixth mask process. The method may further include forming a buffer layer on the substrate.

Another aspect is an organic light emitting display comprising: a gate electrode formed over a substrate; an active layer electrically insulated from the gate electrode, wherein the gate electrode is closer to the substrate than the active layer; a first gate insulating layer and a second gate insulating layer formed between the gate electrode and active layer so as to electrically insulate the active layer from the gate electrode; and source and drain electrodes each contacting the active layer.

In the above display, the active layer is formed at least partially of oxygen and at least one selected from the group consisting of Ga, In, Zn, Hf, and Sn. In the above display, the first gate insulating layer and the second gate insulating layer are formed adjacent to each other. In the above display, the first gate insulating layer covers the gate electrode.

The above display further comprises: a plurality of pixel electrodes formed on the first gate insulating layer; a plurality of pixel-defining layers formed between the pixel electrodes; a plurality of organic layers formed on the pixel electrodes and the pixel defining layers; and a counter electrode formed on the organic layers.

In the above display, the second gate insulating layer contacts i) at least one of the pixel electrodes and ii) at least one of the pixel defining layers. In the above display, at least one of the organic layers contacts the second gate insulating layer. In the above display, the active layer contacts at least one of the pixel-defining layers. In the above display, the source and drain electrodes contact part of the second gate insulating layer.

Another aspect is a method of manufacturing an organic light emitting display, the method comprising: performing a first mask process so as to form a first conductive layer on a substrate and pattern the first conductive layer to form a gate electrode of a thin film transistor; performing a second mask process so as to form a first insulating layer on the resulting structure obtained according to the first mask process, form a second conductive layer on the first insulating layer, and pattern the second conductive layer to form a pixel electrode; performing a third mask process so as to form a second insulating layer on the resulting structure obtained according to the second mask process, form a semiconductor layer on the second insulating layer, and pattern the semiconductor layer to form an active layer of the thin film transistor; performing a fourth mask process so as to remove a portion of the second insulating layer to expose a portion of the pixel electrode; performing a fifth mask process so as to form a third conductive layer on the resulting structure obtained according to the fourth mask process and pattern the third conductive layer to form source and drain electrodes of the thin film transistor; and performing a sixth mask process so as to form a third insulating layer on the resulting structure obtained according to the fifth mask process and remove the third insulating layer to expose the pixel electrode.

In the above method, the active layer is formed at least partially of oxygen and at least one element selected from the group consisting of Ga, In, Zn, Hf, and Sn. In the above method, the first insulating layer is formed as a first gate insulating layer, wherein the second insulating layer is formed as a second gate insulating layer, and wherein the first gate insulating layer and the second gate insulating layer contact each other. The above method further comprises sequentially forming i) an intermediate layer comprising an emissive layer and ii) a counter electrode on the resulting structure obtained according to the sixth mask process. The above method further comprises forming a buffer layer between the substrate and the gate electrode, wherein the buffer layer contacts the first gate insulating layer.

Another aspect is an organic light emitting display comprising: a gate electrode formed over a substrate; a first gate insulating layer substantially covering the gate electrode; a second gate insulating layer formed on the first gate insulating layer; an active layer formed over and contacting the second gate insulating layer; and source and drain electrodes formed over and contacting the active layer.

The above display further comprises: a pixel electrode formed on the first gate insulating layer, wherein at least part of the pixel electrode is interposed between the first and second gate insulating layers; an organic light emission layer formed on the pixel electrode; and a counter electrode formed on the organic light emission layer.

The above display further comprises a pixel-defining layer formed between the second gate insulating layer and organic light emission layer, wherein the pixel-defining layer covers i) the source and drain electrodes, ii) part of the active layer and iii) part of the second gate insulating layer. In the above display, the first and second gate insulating layers have substantially the same thickness.

In the above display, the active layer covers at least part of the second gate insulating layer, and wherein the active layer is farther from the substrate than the first and second gate insulating layers. In the above display, the first gate insulating layer does not contact the pixel-defining layer.

DETAILED DESCRIPTION

In general, to form micro-patterns of electrical components such as a thin film transistor on the substrate used in flat panel displays, micro-patterns formed in masks are transferred to a substrate. For this process, a photolithography process is generally used. The photolithography process is performed as follows: a substrate to be patterned is uniformly coated with a photoresist, the photoresist is exposed to light using a mask with patterns and by using exposure equipment such as a stepper, and the photoresist is developed (when a positive photoresist is used). In addition, after the photoresist is developed, patterns are etched using the remaining photoresist as a mask, and the unnecessary photoresist is removed.

In the process of transferring patterns using a mask, a mask with desired patterns is needed, and thus as the number of processes using a mask increases, the manufacturing costs for the masks increases. In addition, due to the complicated operations described above, the manufacturing processes are complicated, the manufacturing time increases, and the manufacturing costs are high.

Embodiments will now be described in more detail with reference to the accompanying drawings.

Figure 17:
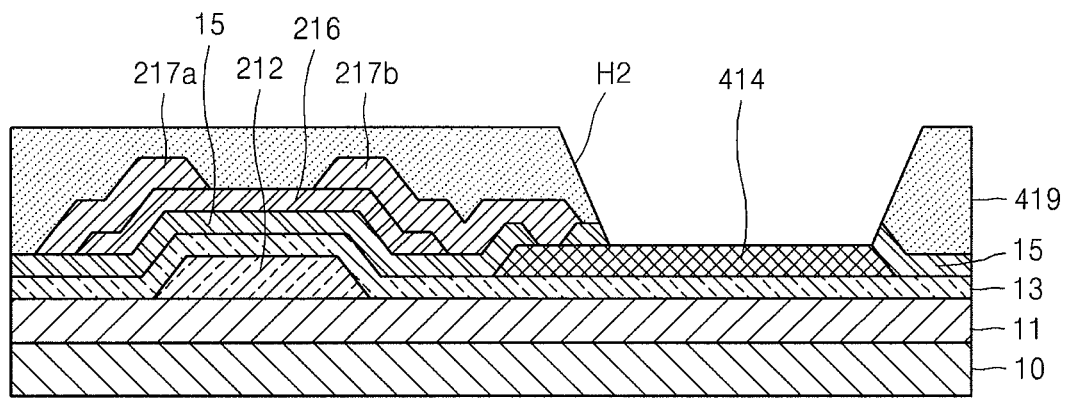
Figure 18:
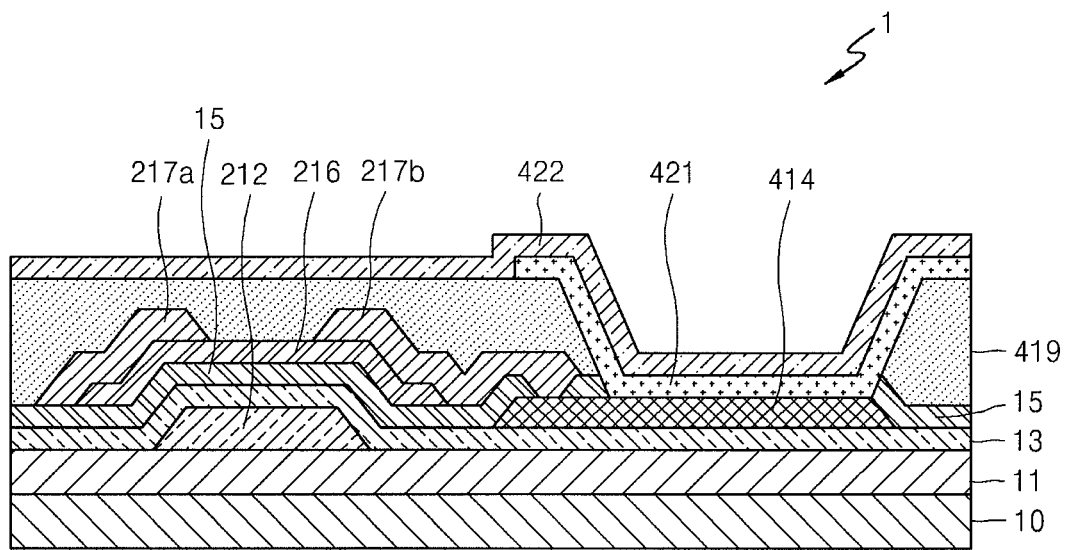
FIG. 18 is a schematic cross-sectional view of an organic light emitting display manufactured using the method illustrated in FIGS. 1 through 17, according to an embodiment.

Referring to FIGS. 1 through 18, the organic light emitting display 1 according to an embodiment includes a substrate 10, a buffer layer 11 (See FIG. 1), a thin film transistor 2, and an organic light emitting diode 4 (See FIG. 18).

Figure 1:
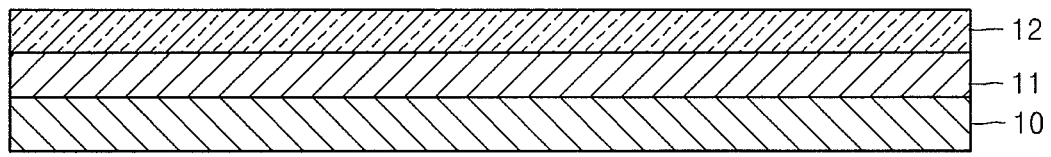
FIGS. 1 through 17 are schematic cross-sectional views sequentially illustrating a method of manufacturing an organic light emitting display, according to an embodiment.

Referring to FIG. 1, the buffer layer 11 and a first conductive layer 12 are sequentially formed on the substrate 10.

The substrate 10 may be formed at least partially of a transparent glass material including $SiO_2$ as a main component. Also, the substrate 10 may be formed at least partially of an opaque material, or other materials, such as plastic. In a bottom emission type organic light emitting display in which an image is displayed through the substrate 10, the substrate 10 may be formed at least partially of a transparent material.

The buffer layer 11 may be formed on the substrate 10 to provide the substrate 10 with a smooth surface and prevent impurity elements from penetrating into the substrate 10. The buffer layer 11 may be formed by depositing, for example, $SiO_2$ and/or $SiN_x$ on the substrate 10 by, for example, plasma enhanced chemical vapor deposition (PECVD), atmospheric pressure CVD (APCVD), or low pressure CVD (LPCVE).

The first conductive layer 12 is formed on the buffer layer 11. The first conductive layer 12 may be formed of at least one transparent material selected from the group consisting of ITO, IZO, ZnO, and $In_2O_3$. The first conductive layer 12 may also be formed of at least one material selected from the group consisting of Ag, Mg, Al, Pt, Pd, Au, Ni, Nd, Ir, Cr, Li, Ca, Mo, Ti, W, MoW, and Al/Cu. The first conductive layer 12 is used to form a gate electrode 212 of the thin film transistor 2 (See, for example, FIG. 17), which will be described later.

Figure 2:
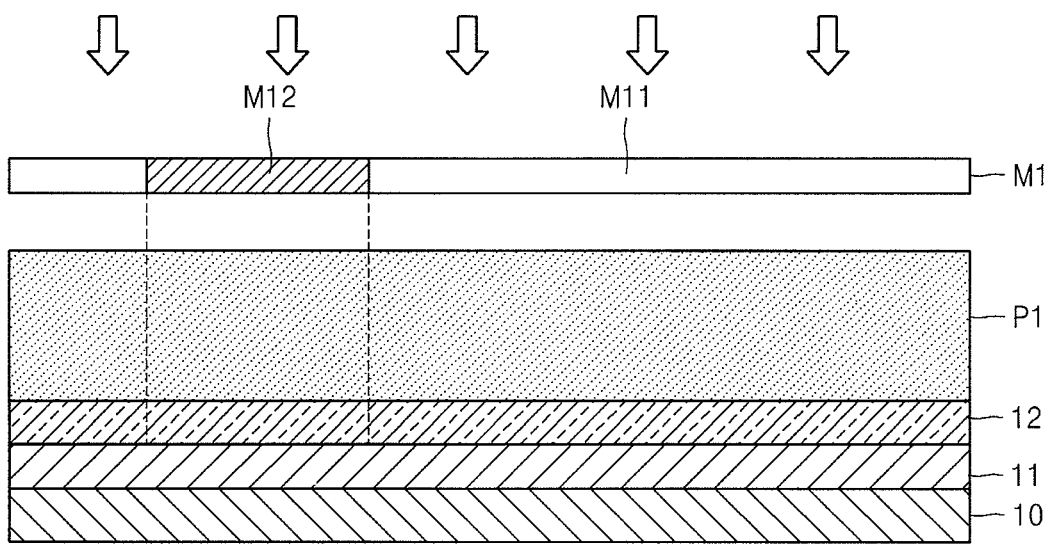

Referring to FIG. 2, a first photoresist layer P1 is formed on the resulting structure of FIG. 1 by coating the structure of FIG. 1 with a photoresist and pre-baking or soft-baking the photoresist to remove the solvent. Next, to pattern the first photoresist layer P1, a first mask M1 with a predetermined pattern is substantially aligned with the substrate 10. The first mask M1 includes a light transmitting portion M11 and a light blocking portion M12. The light transmitting portion M11 transmits light in a predetermined wavelength range, and the light blocking portion M12 blocks the irradiated light. Subsequently, the first photoresist layer P1 is exposed to light irradiated thereto in a predetermined wavelength range. In the present embodiment, a positive photoresist (positive PR) is used to remove regions exposed to light; however, a negative PR may also be used.

When the first photoresist layer P1 is exposed to light, a portion of the first photoresist layer P1 formed substantially directly below the light transmitting portion M11 of the first mask M1 is removed, and a portion of the first photoresist layer P1 formed substantially directly below the light blocking portion M12 of the first mask M1 remains. Using the patterns of the first photoresist layer P1 as a mask, the first conductive layer 12 is etched using an etching device. In this manner, a portion of the first conductive layer 12 is etched, and a non-etched portion of the first conductive layer 12 is formed as the gate electrode 212 of the thin film transistor 2, as illustrated in FIG. 3.

Figure 3:
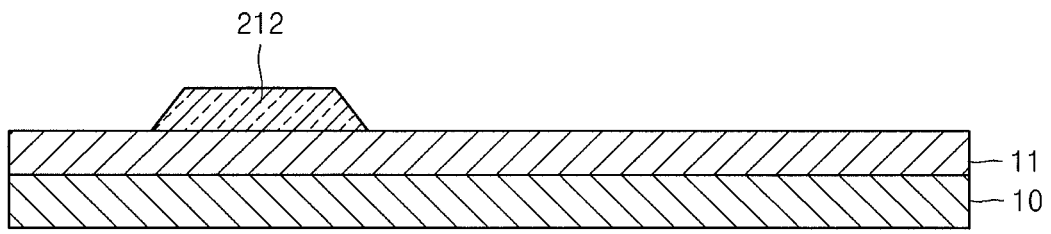
Figure 4:
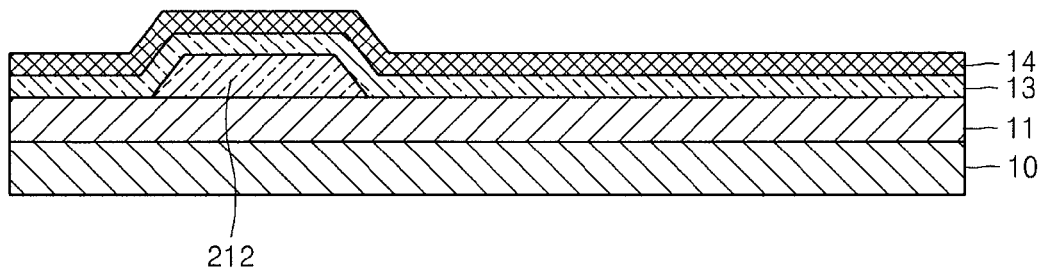

Referring to FIG. 4, a first insulating layer 13 and a second conductive layer 14 are sequentially formed on the resulting structure of FIG. 3 obtained according to the first mask process.

The first insulating layer 13 may be formed by depositing an inorganic material such as $SiN_x$ or $SiO_x$ on the resulting structure of FIG. 3 by, for example, PECVD, APCVD, or LPCVD. The first insulating layer 13 is disposed between the gate electrode 212 of the thin film transistor 2 and an active layer 216 (See, for example, FIG. 9), which will be described later, to function as a first gate insulating layer of the thin film transistor 2.

The second conductive layer 14 may be formed of at least one transparent material selected from the group consisting of ITO, IZO, ZnO, and $In_2O_3$. The second conductive layer 14 is used to form a pixel electrode 414 (See FIG. 6) of the organic light emitting display 1, which will be described later.

Figure 5:
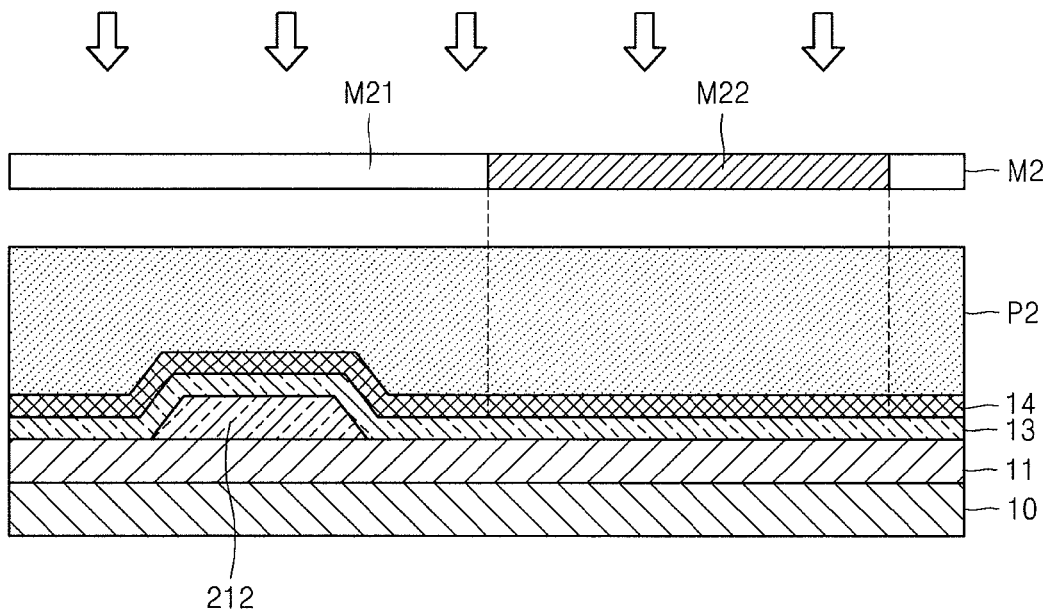

Next, referring to FIG. 5, a second photoresist layer P2 is formed on the second conductive layer 14, and a second mask M2 is substantially aligned with the substrate 10.

Referring to FIG. 5, the second photoresist layer P2 is formed on the resulting structure of FIG. 4 by coating the resulting structure of FIG. 4 with a photoresist and pre-baking or soft-baking the photoresist to remove the solvent. Next, to pattern the second photoresist layer P2, the second mask M2 with a predetermined pattern is substantially aligned with the substrate 10. The second photoresist layer P2 is then exposed to light by irradiating light in a predetermined wavelength range thereto.

When the second photoresist layer P2 is exposed to light, a portion of the second photoresist layer P2 formed substantially directly below a light transmitting portion M21 of the second mask M2 is removed, and a portion of the second photoresist layer P2 formed substantially directly below a light blocking portion M22 of the second mask M2 remains. Using the patterns of the photoresist layer P2 as a mask, the second conductive layer 14 is etched using an etching device. In this manner, a portion of the second conductive layer 14 is etched, and a non-etched portion of the second conductive layer 14 is formed as the pixel electrode 414 of the organic light emitting display 1, as illustrated in FIG. 6.

Figure 6:
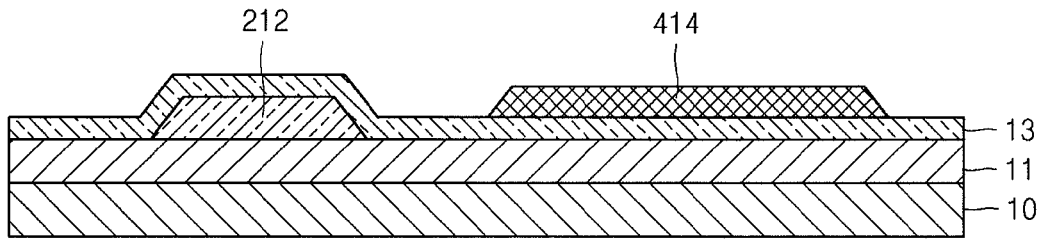
Figure 7:
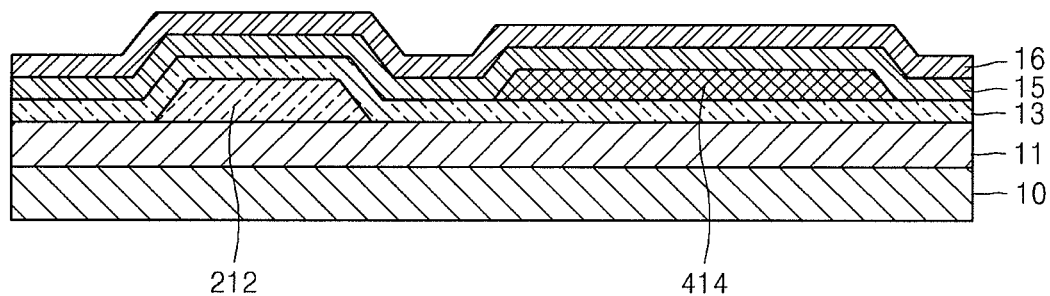

Referring to FIG. 7, a second insulating layer 15 and a semiconductor layer 16 are sequentially formed on the resulting structure of FIG. 6 obtained according to the second mask process.

The second insulating layer 15 may be formed by depositing an inorganic material such as $SiN_x$ or $SiO_x$ on the resulting structure of FIG. 6 by, for example, PECVD, APCVD, or LPCVD. The second insulating layer 15 is disposed between the gate electrode 212 of the thin film transistor 2 and the active layer 216 (see, for example, FIG. 9), which will be described later, to function as a second gate insulating layer of the thin film transistor 2. In one embodiment, the first and second gate insulating layers 13 and 15 may have substantially the same thickness. In another embodiment, the first and second gate insulating layers 13 and 15 have different thicknesses.

The semiconductor layer 16 may be formed at least partially of an oxide. For example, the semiconductor layer 16 may be formed at least partially of oxygen and at least one element selected from the group consisting of Ga, In, Zn, Hf, and Sn. As another example, the semiconductor layer 16 may be formed at least partially of ZnO, ZnGaO, ZnInO, GaInO, GaSnO, ZnSnO, InSnO, ZnGaInO, or HfInZnO. The semiconductor layer 16 is used to form the active layer 216 of the thin film transistor 2, which will be described later.

Figure 8:
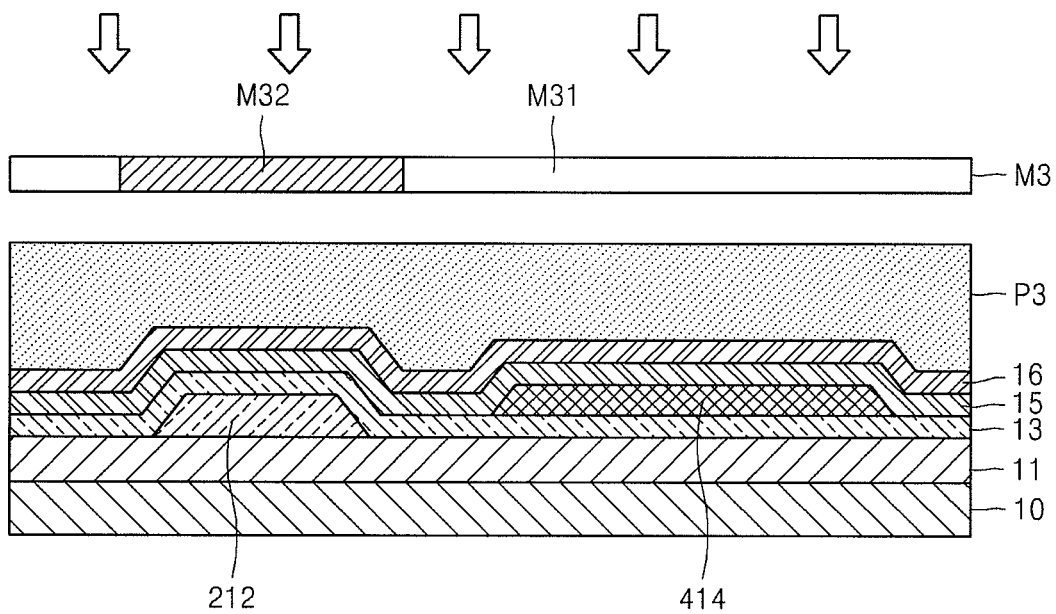

Referring to FIG. 8, a third photoresist layer P3 is formed on the semiconductor layer 16, and a third mask M3 is substantially aligned with the substrate 10.

The third photoresist layer P3 may be formed on the resulting structure of FIG. 7 by coating the structure of FIG. 7 with a photoresist and pre-baking or soft-baking the photoresist to remove the solvent. Next, to pattern the third photoresist layer P3, the third mask M3 with a predetermined pattern is substantially aligned with the substrate 10. The third photoresist layer P3 is then exposed to light by irradiating light in a predetermined wavelength range thereto.

When the third photoresist layer P3 is exposed to light, a portion of the third photoresist layer P3 formed substantially directly below a light transmitting portion M31 of the third mask M3 is removed, and a portion of the third photoresist layer P3 formed substantially directly below a light blocking portion M32 of the third mask M3 remains. Using the patterns of the third photoresist layer P3 as a mask, the semiconductor layer 16 is etched using an etching device. In this manner, a portion of the semiconductor layer 16 is etched, and a non-etched portion of the semiconductor layer 16 is formed as the active layer 216 of the thin film transistor 2, as illustrated in FIG. 9.

Figure 9:
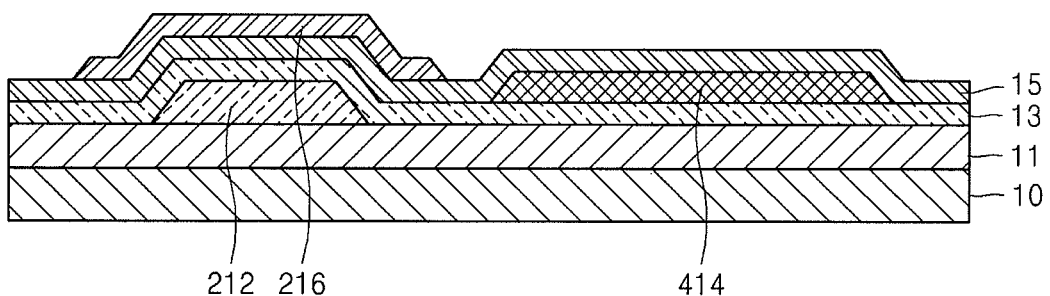
Figure 10:
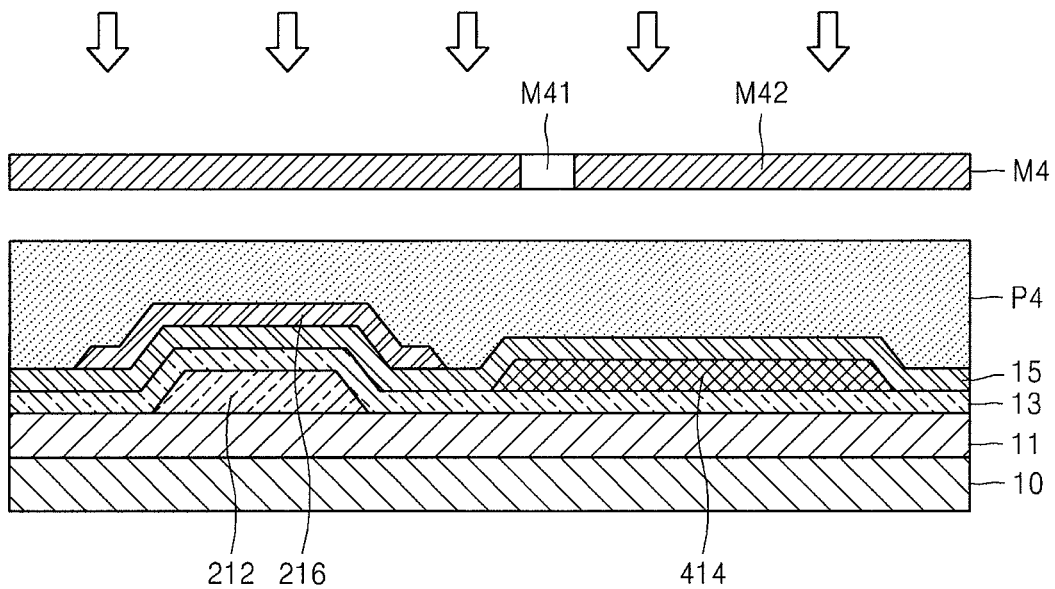

Referring to FIG. 10, a fourth photoresist layer P4 is formed on the resulting structure of FIG. 9 obtained according to the third mask process, and then a fourth mask M4 is substantially aligned with the substrate 10.

The fourth mask M4 includes a light transmitting portion M41 corresponding to a portion of the pixel electrode 414 and a light blocking portion M42. Using the fourth mask M4 substantially aligned with the substrate 10, the fourth photoresist layer P4 is exposed to light.

Figure 11:
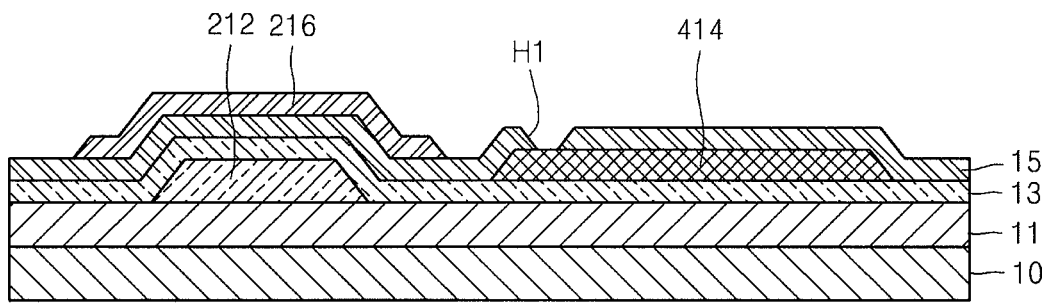

Referring to FIG. 11, the resulting structure of FIG. 11 is obtained such that after portions of the fourth photoresist layer P4 exposed to light are removed, the resulting structure is etched using the remaining patterns of the fourth photoresist layer P4 as a mask, thereby resulting in forming a hole H1 in the second insulating layer 15, which exposes a portion of the pixel electrode 414

Figure 12:
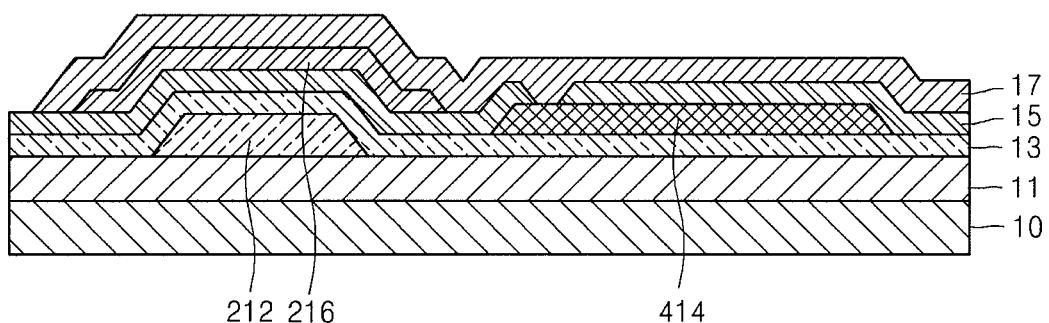

Referring to FIG. 12, a third conductive layer 17 is formed on the resulting structure of FIG. 11 obtained according to the fourth mask process. The third conductive layer 17 may be formed by depositing an amorphous silicon, including N-type or P-type impurities, on the resulting structure of FIG. 11 and heat treating the amorphous silicon. The third conductive layer 17 is patterned as a source region 217a and a drain region 217b of the thin film transistor 2 (see, for example, FIG. 14).

Figure 13:
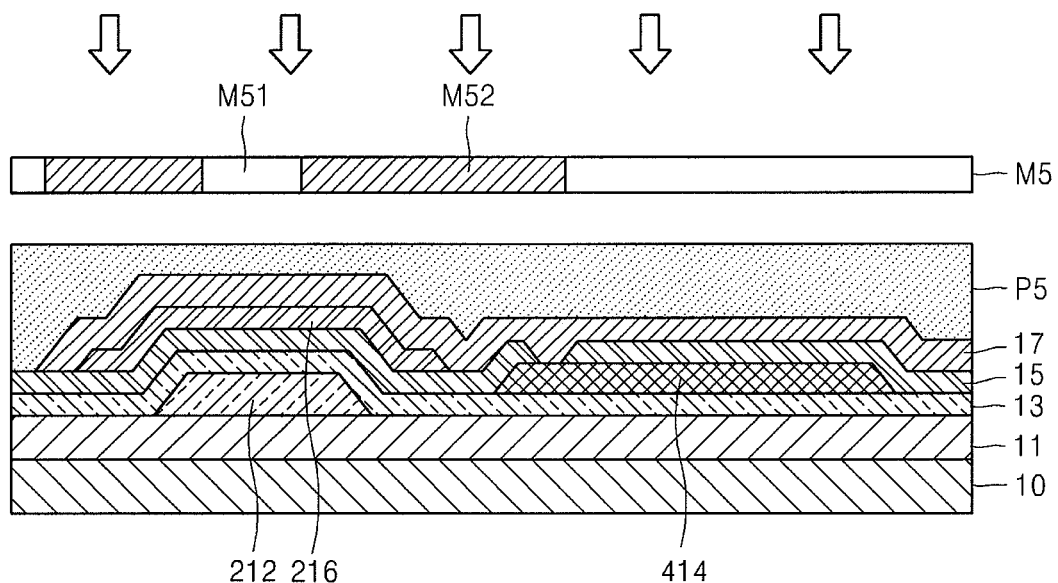

Next, referring to FIG. 13, a fifth photoresist layer P5 is formed on the third conductive layer 17, and a fifth mask M5 is substantially aligned with the substrate 10.

The fifth photoresist layer P5 may be formed by coating the resulting structure of FIG. 12 with a photoresist and pre-baking or soft-baking the photoresist to remove the solvent. Then, to pattern the fifth photoresist layer P5, the fifth mask M5 with a predetermined pattern is substantially aligned with the substrate 10, and the fifth photoresist layer P5 is exposed to light by irradiating light in a predetermined wavelength range thereto.

As a result of the light exposure process, a portion of the fifth photoresist layer P5 formed substantially directly below a light transmitting portion M51 of the fifth mask M5 is removed, and a portion of the fifth photoresist layer P5 formed substantially directly below a light blocking portion M52 of the fifth mask M5 remains. Using the patterns of the fifth photoresist layer P5 as a mask, the third conductive layer 17 is etched using an etching device. In this manner, a portion of the third conductive layer 17 is etched, and a non-etched portion of the third conductive layer 17 is formed as the source region 217a and the drain region 217b of the thin film transistor 2.

Figure 14:
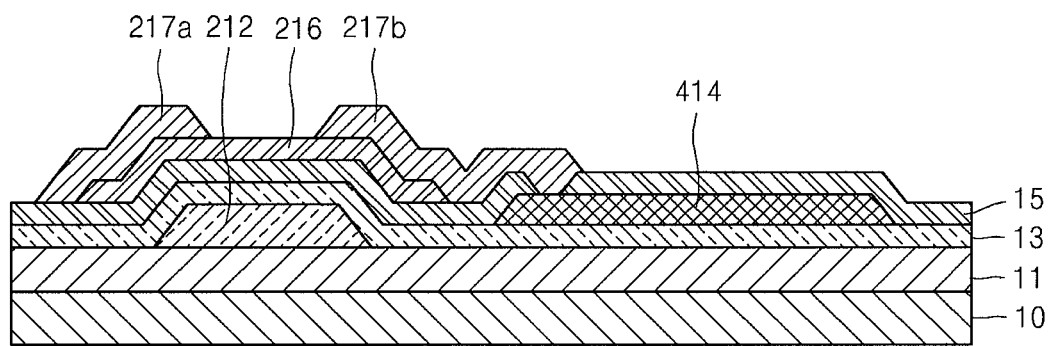
Figure 15:
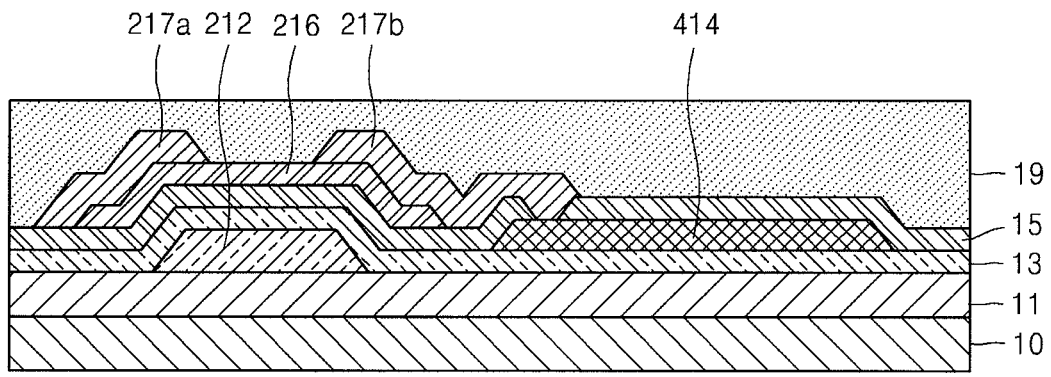

Referring to FIG. 15, a third insulating layer 19 is formed on the resulting structure of FIG. 14 obtained according to the fifth mask process.

The third insulating layer 19 may be formed at least partially of at least one organic insulating material selected from the group consisting of polyimide, polyamide, an acryl resin, benzocyclobutene and a phenol resin by using a spin coating method. The third insulating layer 19 may also be formed at least partially of an inorganic insulating material used to form the first insulating layer 13 and the second insulating layer 15. The third insulating layer 19 acts as a pixel defining layer of the organic light emitting display, which will be described later, after an etching process using a sixth mask M6.

Figure 16:
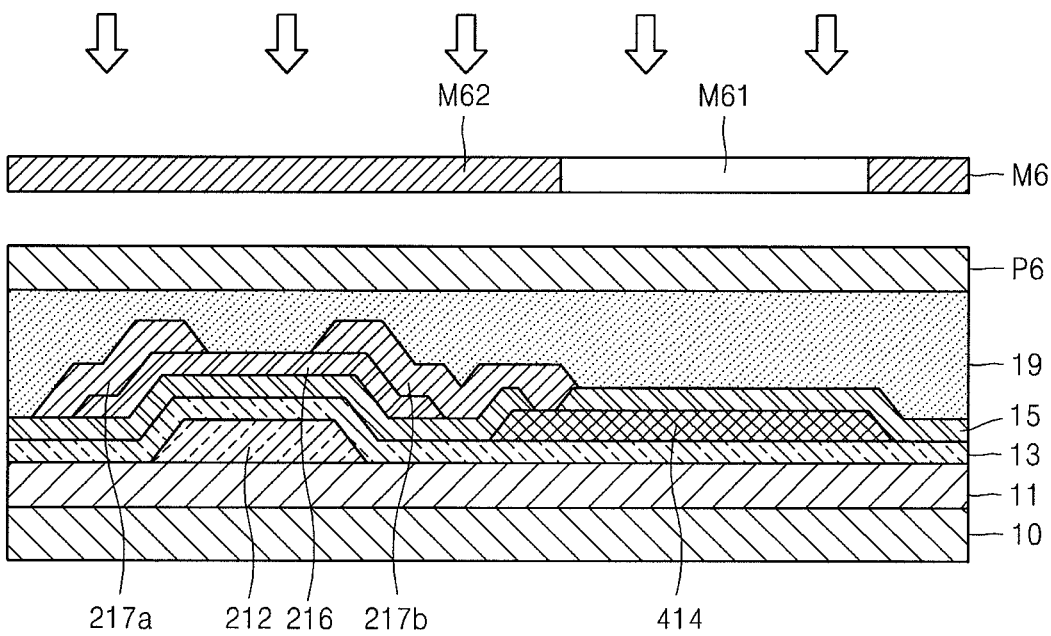

Next, referring to FIG. 16, a sixth photoresist layer P6 is formed on the third insulating layer 19, and a sixth mask M6 is substantially aligned with the substrate 10.

The sixth mask M6 includes a light transmitting portion M61 corresponding to the pixel electrode 414 and a light blocking portion M62. When light is irradiated to the sixth mask M6, the organic insulating material of a portion of the third insulating layer 19 through which the light is transmitted may be directly removed by dry etching. In the first through fifth mask processes described above, the first through fifth photoresist layers P1 to P5 are exposed to light and developed, and the remaining structure is patterned using the developed photoresist layer as a mask. However, in the present embodiment, without using a separate photoresist layer, the third insulating layer 19 formed at least partially of an organic insulating material may be directly dry etched.

In one embodiment, as shown in FIG. 17, the third insulating layer 19 is dry etched to form a hole H2 through which the pixel electrode 414 is exposed. As a result, a pixel defining layer 419 defining pixels is formed. The pixel defining layer 419 has a predetermined thickness, thereby widening a gap between edges of the pixel electrode 414 and a counter electrode 422 (FIG. 18), thus preventing the occurrence of an electric field concentration phenomenon at the edges of the pixel electrode 414. As a result, the pixel defining layer 419 prevents the pixel electrode 414 and the counter electrode 422 from being short-circuited from each other. Referring to FIG. 18, an intermediate layer 421 including an organic emissive layer is formed on the exposed portion of the pixel electrode 414 and a portion of the pixel defining layer 419, and the counter electrode 422 is formed on the intermediate layer 421 and the pixel defining layer 419

The organic emissive layer of the intermediate layer 421 is electrically driven by the counter electrode 422 to emit light. The organic emissive layer may be formed at least partially of a low molecular or high molecular weight organic compound.

In one embodiment, when the organic emissive layer is formed of a low molecular weight organic compound, the intermediate layer 421 may include a hole transport layer (HTL) and a hole injection layer (HIL) that are sequentially stacked on the organic emissive layer towards the pixel electrode 414, and an electron transport layer (ETL) and an electron injection layer (EIL) that are sequentially stacked on the organic emissive layer towards the counter electrode 422. Other layers may also be stacked, depending one the embodiment. An organic material used may be copper phthalocyanine (CuPc), N,N-Di(naphthalene-1-yl)-N,N'-diphenyl-benzidine (NPB), or tris-8-hydroxyquinoline aluminum ($Alq_3$).

In one embodiment, when the organic emissive layer is formed of a high molecular weight organic compound, the intermediate layer 421 may include only the HTL formed on the organic emissive layer towards the pixel electrode 414. The HTL may be formed on the pixel electrode 414 by ink-jet printing or spin coating poly-(2,4)-ethylene-dihydroxy thiophene (PEDOT) or polyaniline (PANI). An organic material used may be a high molecular weight organic compound, such as poly-phenylenevinylene (PPV)-based organic compound or a polyfluorene-based organic compound. Color patterns may be formed using a commonly used method such as by ink-jet printing, spin coating, or heat transfer using a laser.

The counter electrode 422 is formed on the intermediate layer 421 including the organic emissive layer. In one, the pixel electrode 414 is used as an anode, and the counter electrode 422 is used as a cathode. In another embodiment, the pixel electrode 414 is used as a cathode, and the counter electrode 422 is used as an anode.

In a top emission type organic light emitting display in which an image is displayed on the opposite side of the substrate 10, the pixel electrode 414 is a reflective electrode, and the counter electrode 422 is a transparent electrode. The reflective electrode may be formed at least partially of a metal with a low work function, such as Ag, Mg, Al, Pt, Pd, Au, Ni, Nd, Ir, Cr, Li, Ca, LiF/Ca, LiF/Al, or compounds thereof, in a thin film.

Although not illustrated in FIG. 18, a sealing element (not shown) and an absorbent element (not shown) may be further formed on the counter electrode 422 to protect the organic emissive layer from external moisture or oxygen.

According to one embodiment, the organic light emitting display 1 having the above-described structure may be manufactured using a small number of masks, and thus manufacturing costs are reduced. In addition, the manufacturing processes may be simplified, resulting in low manufacturing costs.

In addition, when a gate insulating layer has a double-layered structure, the roughness of the pixel electrode 414 may be low. For example, in a conventional organic light emitting display (not necessarily prior art), the pixel electrode 414 is disposed below the gate electrode 212 or the source and drain regions 217a and 217b. In such a structure, to expose the pixel electrode 414, the gate electrode 212 or the source and drain regions 217a and 217b need to be etched. In addition, in a doping process of the thin film transistor 2, the exposed pixel electrode 414 is likely to be doped. These processes increase the surface roughness of the pixel electrode 414. On the other hand, according to an embodiment, the pixel electrode 414 is disposed between the double-layered gate insulating layer, whereby an increase in the surface roughness of the pixel electrode 414 caused by etching an upper metal electrode may be minimized.

In addition, when a single gate insulating layer is used, tetraethyl orthosilicate (TEOS) is widely used to form the gate insulating layer. However, when a thickness of a lower metal electrode is large, the step coverage is insufficient by using only TEOS. This is because an increase in the thickness of TEOS to obtain sufficient step coverage causes a change in electrical capacitance. According to at least one embodiment, the gate insulating layer has a double-layered structure, thereby minimizing the change in electrical capacitance. In addition, the step coverage of a lower electrode is enhanced.

As described above, according to at least one embodiment, the organic light emitting display may be manufactured using a small number of masks, and thus manufacturing costs may be reduced. In addition, the manufacturing processes may be simplified, thereby reducing manufacturing costs.

While embodiments have been particularly shown and described with reference to the drawings, it will be understood by those of ordinary skill in the art that various changes in form and details may be made therein without departing from the spirit and scope of the following claims.

What is claimed is:

1. An organic light emitting display comprising:
   a gate electrode formed over a substrate;
   an active layer electrically insulated from the gate electrode;
   a first gate insulating layer and a second gate insulating layer formed between the gate electrode and active layer so as to electrically insulate the active layer from the gate electrode, wherein the distance between the substrate and the second gate insulating layer is greatest at the top of the second gate insulating layer;
   source and drain electrodes each contacting the active layer; and
   a pixel electrode at least a portion of which is formed between and contacts both the first gate insulating layer and the second gate insulating layer, wherein the distance between the substrate and the pixel electrode is greatest at the top of the pixel electrode,
   wherein the first gate insulating layer and the second gate insulating layer have substantially the same thickness, and
   wherein the top of the second gate insulating layer is a greater distance from the substrate than the top of the pixel electrode is from the substrate.

2. The display of claim 1, wherein the active layer is formed at least partially of oxygen and at least one selected from the group consisting of Ga, In, Zn, Hf, and Sn.

3. The display of claim 1, wherein the first gate insulating layer and the second gate insulating layer are formed adjacent to each other.

4. The display of claim 1, wherein the first gate insulating layer covers the gate electrode.

5. The display of claim 1, further comprising:
   a plurality of pixel electrodes formed on the first gate insulating layer;
   a plurality of pixel-defining layers formed between the pixel electrodes;
   a plurality of organic layers formed on the pixel electrodes and the pixel defining layers; and
   a counter electrode formed on the organic layers.

6. The display of claim 5, wherein the second gate insulating layer contacts i) at least one of the pixel electrodes and ii) at least one of the pixel defining layers.

7. The display of claim 5, wherein at least one of the organic layers contacts the second gate insulating layer.

8. The display of claim 5, wherein the active layer contacts at least one of the pixel-defining layers.

9. The display of claim 1, wherein the source and drain electrodes contact part of the second gate insulating layer.

10. The display of claim 1, wherein the active layer is formed over the first and second gate insulating layers.

11. The display of claim 1, wherein the first gate insulating layer is formed over the gate electrode, wherein the second gate insulating layer is formed over the first gate insulating layer, and wherein the active layer is formed over the second gate insulating layer.

* * * * *